(12) United States Patent
Sugar et al.

(10) Patent No.: US 7,881,674 B2
(45) Date of Patent: *Feb. 1, 2011

(54) SYSTEM AND METHOD FOR ANTENNA DIVERSITY USING EQUAL POWER JOINT MAXIMAL RATIO COMBINING

(75) Inventors: Gary L. Sugar, Rockville, MD (US); Chandra Vaidyanathan, Bethesda, MD (US)

(73) Assignee: IPR Licensing, Inc., Wilmington, DE (US)

( * ) Notice: Subject to any disclaimer, the term of this patent is extended or adjusted under 35 U.S.C. 154(b) by 17 days.

This patent is subject to a terminal disclaimer.

(21) Appl. No.: 11/879,156

(22) Filed: Jul. 16, 2007

(65) Prior Publication Data

US 2008/0014977 A1 Jan. 17, 2008

Related U.S. Application Data

(63) Continuation of application No. 10/800,610, filed on Mar. 15, 2004, now Pat. No. 7,245,881, which is a continuation of application No. 10/174,689, filed on Jun. 19, 2002, now Pat. No. 6,785,520.

(60) Provisional application No. 60/361,055, filed on Mar. 1, 2002, provisional application No. 60/365,797, filed on Mar. 21, 2002, provisional application No. 60/380,139, filed on May 6, 2002.

(51) Int. Cl.
  *H04B 7/02* (2006.01)
(52) U.S. Cl. ............... 455/69; 455/115.1; 455/127.1
(58) Field of Classification Search ........... 455/522, 455/63.4, 67.11, 115.1, 69, 127.1, 1, 115; 370/329, 332
See application file for complete search history.

(56) References Cited

U.S. PATENT DOCUMENTS

| 4,121,221 A | 10/1978 | Meadows |
| 4,599,734 A | 7/1986 | Yamamoto |
| 4,639,914 A | 1/1987 | Winters |
| 4,811,420 A | 3/1989 | Avis et al. |

(Continued)

FOREIGN PATENT DOCUMENTS

WO 99/40648 8/1999

(Continued)

OTHER PUBLICATIONS

"BLAST High-Level Overview", Lucent Technologies, Jul. 18, 2000.

(Continued)

*Primary Examiner*—Blane J Jackson
(74) *Attorney, Agent, or Firm*—Volpe And Koenig, P.C.

(57) ABSTRACT

An equal gain composite beamforming technique which includes the constraint that the power of the signal output by each antenna is the same, and is equal to the total power of the transmit signal divided by the number N of transmit antennas from which the signal is to be transmitted. By reducing output power requirements for each power amplifier, the silicon area of the power amplifiers are reduced by as much as N times (where N is equal to the number of transmit antennas) relative to a non-equal gain composite beamforming technique.

5 Claims, 11 Drawing Sheets

U.S. PATENT DOCUMENTS

| | | |
|---|---|---|
| 5,274,844 A | 12/1993 | Harrison et al. |
| 5,394,435 A | 2/1995 | Weerackody |
| 5,437,055 A | 7/1995 | Wheatley, III |
| 5,457,808 A | 10/1995 | Osawa et al. |
| 5,491,723 A | 2/1996 | Diepstraten |
| 5,493,307 A | 2/1996 | Tsujimoto |
| 5,493,722 A | 2/1996 | Gunn et al. |
| 5,507,035 A | 4/1996 | Bantz et al. |
| 5,539,832 A | 7/1996 | Weinstein et al. |
| 5,570,366 A | 10/1996 | Baker et al. |
| 5,577,265 A | 11/1996 | Wheatley, III |
| 5,610,617 A | 3/1997 | Gans et al. |
| 5,621,732 A | 4/1997 | Osawa |
| 5,752,173 A | 5/1998 | Tsujimoto |
| 5,761,193 A | 6/1998 | Derango et al. |
| 5,761,237 A | 6/1998 | Petersen et al. |
| 5,771,462 A | 6/1998 | Olsen |
| 5,812,531 A | 9/1998 | Cheung et al. |
| 5,848,105 A | 12/1998 | Gardner et al. |
| 5,854,611 A | 12/1998 | Gans et al. |
| 5,898,679 A | 4/1999 | Brederveld et al. |
| 5,912,921 A | 6/1999 | Warren et al. |
| 5,924,020 A | 7/1999 | Forssen et al. |
| 5,930,248 A | 7/1999 | Langlet et al. |
| 5,982,327 A | 11/1999 | Vook et al. |
| 5,999,826 A | 12/1999 | Whinnett |
| 6,008,760 A | 12/1999 | Shattil |
| 6,018,642 A | 1/2000 | Adachi |
| 6,023,625 A | 2/2000 | Myers, Jr. |
| 6,037,898 A | 3/2000 | Parish et al. |
| 6,038,272 A | 3/2000 | Golden et al. |
| 6,044,120 A | 3/2000 | Bar-David et al. |
| 6,058,105 A | 5/2000 | Hochwald et al. |
| 6,064,338 A | 5/2000 | Kobayakawa et al. |
| 6,091,934 A | 7/2000 | Berman et al. |
| 6,097,771 A | 8/2000 | Foschini |
| 6,118,788 A | 9/2000 | Kermani |
| 6,122,260 A | 9/2000 | Liu et al. |
| 6,124,824 A | 9/2000 | Xu et al. |
| 6,141,393 A | 10/2000 | Thomas et al. |
| 6,141,567 A | 10/2000 | Youssefmir et al. |
| 6,144,651 A | 11/2000 | Rinchiuso et al. |
| 6,144,711 A | 11/2000 | Raleigh et al. |
| 6,147,985 A | 11/2000 | Bar-David et al. |
| 6,157,340 A | 12/2000 | Xu et al. |
| 6,157,843 A | 12/2000 | Derango et al. |
| 6,177,906 B1 | 1/2001 | Petrus |
| 6,185,440 B1 | 2/2001 | Barratt et al. |
| 6,195,045 B1 | 2/2001 | Xu et al. |
| 6,211,671 B1 | 4/2001 | Shattil |
| 6,218,986 B1 | 4/2001 | Yukitomo et al. |
| 6,249,250 B1 | 6/2001 | Namekata et al. |
| 6,252,548 B1 | 6/2001 | Jeon |
| 6,252,884 B1 | 6/2001 | Hunter |
| 6,266,528 B1 | 7/2001 | Farzaneh |
| 6,295,026 B1 | 9/2001 | Chen et al. |
| 6,298,092 B1 | 10/2001 | Heath, Jr. |
| 6,307,882 B1 | 10/2001 | Marzetta |
| 6,317,466 B1 | 11/2001 | Foschini et al. |
| 6,327,310 B1 | 12/2001 | Hochwald et al. |
| 6,331,837 B1 | 12/2001 | Shattil |
| 6,349,219 B1 | 2/2002 | Hochwald et al. |
| 6,351,499 B1 | 2/2002 | Paulraj et al. |
| 6,362,781 B1 | 3/2002 | Thomas et al. |
| 6,369,758 B1 | 4/2002 | Zhang |
| 6,370,182 B2 | 4/2002 | Bierly et al. |
| 6,377,631 B1 | 4/2002 | Raleigh |
| 6,377,636 B1 | 4/2002 | Paulraj et al. |
| 6,377,819 B1 | 4/2002 | Gesbert et al. |
| 6,400,699 B1 | 6/2002 | Airy et al. |
| 6,400,780 B1 | 6/2002 | Rashid-Farrokhi et al. |
| 6,442,214 B1 | 8/2002 | Boleskei et al. |
| 6,462,709 B1 | 10/2002 | Choi |
| 6,463,295 B1 | 10/2002 | Yun |
| 6,473,467 B1 | 10/2002 | Wallace et al. |
| 6,522,898 B1 | 2/2003 | Kohno et al. |
| 6,549,786 B2 | 4/2003 | Cheung |
| 6,570,929 B1 | 5/2003 | Eriksson |
| 6,584,161 B2 | 6/2003 | Hottinen et al. |
| 6,625,162 B2 | 9/2003 | Myojo et al. |
| 6,636,568 B2 | 10/2003 | Kadous |
| 6,646,600 B2 | 11/2003 | Vail et al. |
| 6,684,064 B2 | 1/2004 | Kazakevich et al. |
| 6,687,492 B1 | 2/2004 | Sugar et al. |
| 6,728,294 B1 | 4/2004 | Kohno et al. |
| 6,728,517 B2 | 4/2004 | Sugar et al. |
| 6,792,033 B1 | 9/2004 | Maruta et al. |
| 6,862,271 B2 | 3/2005 | Medvedev et al. |
| 6,873,606 B2 | 3/2005 | Agrawal et al. |
| 6,873,651 B2 | 3/2005 | Tesfai et al. |
| 6,888,878 B2 | 5/2005 | Prysby et al. |
| 6,895,255 B1 | 5/2005 | Bridgelall |
| 6,901,122 B2 | 5/2005 | Nadgauda et al. |
| 6,904,021 B2 | 6/2005 | Belcea |
| 6,940,917 B2 | 9/2005 | Menon et al. |
| 6,956,907 B2 | 10/2005 | Ketchum |
| 6,961,545 B2 | 11/2005 | Tehrani et al. |
| 6,963,742 B2 | 11/2005 | Boros et al. |
| 6,970,682 B2 | 11/2005 | Crilly, Jr. et al. |
| 6,980,600 B1 | 12/2005 | Ratnarajah |
| 6,983,167 B2 | 1/2006 | Adachi et al. |
| 7,027,536 B1 | 4/2006 | Al-Dhahir |
| 7,031,368 B1 | 4/2006 | Maruta et al. |
| 7,042,860 B2 | 5/2006 | Kasami et al. |
| 7,155,231 B2 | 12/2006 | Burke et al. |
| 7,224,758 B1 | 5/2007 | Banister |
| 7,224,942 B2 | 5/2007 | Dent |
| 7,230,940 B2 | 6/2007 | Fantaske |
| 7,277,409 B1 | 10/2007 | Thermond et al. |
| 7,340,279 B2 | 3/2008 | Chen et al. |
| 7,342,875 B2 | 3/2008 | Hammons et al. |
| 2001/0012764 A1 | 8/2001 | Edwards et al. |
| 2001/0015994 A1 | 8/2001 | Nam |
| 2001/0046255 A1 | 11/2001 | Shattil |
| 2001/0053143 A1 | 12/2001 | Li et al. |
| 2001/0053699 A1 | 12/2001 | McCrady et al. |
| 2002/0001316 A1 | 1/2002 | Hornsby et al. |
| 2002/0024975 A1 | 2/2002 | Hendler |
| 2002/0034191 A1 | 3/2002 | Shattil |
| 2002/0039884 A1 | 4/2002 | Raynes et al. |
| 2002/0045435 A1 | 4/2002 | Fantaske |
| 2002/0051430 A1 | 5/2002 | Kasami et al. |
| 2002/0064246 A1 | 5/2002 | Kelkar et al. |
| 2002/0067309 A1 | 6/2002 | Baker et al. |
| 2002/0072392 A1 | 6/2002 | Awater et al. |
| 2002/0085643 A1 | 7/2002 | Kitchener et al. |
| 2002/0102950 A1 | 8/2002 | Gore et al. |
| 2002/0111142 A1 | 8/2002 | Klimovitch |
| 2002/0118781 A1 | 8/2002 | Thomas et al. |
| 2002/0122383 A1 | 9/2002 | Wu et al. |
| 2002/0122501 A1 | 9/2002 | Awater et al. |
| 2002/0127978 A1 | 9/2002 | Khatri |
| 2002/0136170 A1 | 9/2002 | Struhsaker |
| 2002/0141355 A1 | 10/2002 | Struhsaker et al. |
| 2002/0147032 A1 | 10/2002 | Yoon et al. |
| 2002/0158801 A1 | 10/2002 | Crilly, Jr. et al. |
| 2002/0159537 A1 | 10/2002 | Crilly, Jr. et al. |
| 2002/0172186 A1 | 11/2002 | Larsson |
| 2002/0172269 A1 | 11/2002 | Xu |
| 2002/0196842 A1 | 12/2002 | Onggosanusi et al. |
| 2003/0002450 A1 | 1/2003 | Jalali et al. |
| 2003/0022693 A1 | 1/2003 | Gerogiokas et al. |
| 2003/0032423 A1 | 2/2003 | Boros et al. |
| 2003/0048761 A1 | 3/2003 | Jarett |

| | | | |
|---|---|---|---|
| 2003/0108117 | A1 | 6/2003 | Ketchum et al. |
| 2003/0114108 | A1 | 6/2003 | Frecassetti et al. |
| 2003/0125090 | A1 | 7/2003 | Zeira |
| 2003/0139194 | A1 | 7/2003 | Onggosanusi et al. |
| 2003/0157954 | A1 | 8/2003 | Medvedev et al. |
| 2003/0181165 | A1 | 9/2003 | Sugar et al. |
| 2004/0072546 | A1 | 4/2004 | Sugar et al. |
| 2004/0104839 | A1 | 6/2004 | Velazquez et al. |
| 2005/0192048 | A1 | 9/2005 | Bridgelall |
| 2007/0117513 | A1 | 5/2007 | Kasami et al. |

FOREIGN PATENT DOCUMENTS

| | | |
|---|---|---|
| WO | 99/57820 | 11/1999 |
| WO | 01/45300 | 6/2001 |
| WO | 01/69800 | 9/2001 |
| WO | 02/03568 | 1/2002 |

OTHER PUBLICATIONS

"Lucent's 'BLAST' Chips to Take Off in Wireless Market", EETimes.com, Oct. 16, 2002.

Ariyavisitakul et al., "Optimum Space-Time Processors With Dispersive Interference—Unified Analysis And Required Filter Span", 1999 IEEE International Conference on Communications, vol. 2, pp. 1244-1249, (1999).

Aziz et al., "Indoor Throughput and Range Imporvements Using Standard Complaint AP Antenna Diversity in IEEE 802.11a and ETSI HIPERLAN/2", Vehicular Technology Conference, 2002, VTC 2001, Oct. 7-11, 2001, IEEE VTS 54th, vol. 4, pp. 2294-2298.

Bablan et al., "Optimum Diversity Combining and Equalization in Digital Data Transmission with Applications to Cellular Mobile Radio-Part II: Numerical Results"; May 1992; IEEE Transactions on Communications, vol. 30, No. 5; pp. 895-907.

Briesemeister et al., "Role-Based Multicast in Highly Mobile but Sparsely Connect Ad-Hoc Networks"; First Annual Workshop on Mobile Ad Hoc Networking & Computing; pp. 45-50; Aug. 2000.

Brunner et al., "Downlink Beamforming for WCDMA Based on Uplink Channel Parameters"; Proceedings of 3rd European Personal Mobile Conference (EPMCC '99), Mar. 1999, pp. 375-380.

Chiu et al., "OFDM Receiver Design", EE225C, Fall 2000, University of California, Berkeley.

Chizhik et al., "Keyholes, Correlations, and Capacities of Multielement Transmit and Receiver Antennas", IEEE Transactions on Wireless Communications, vol. 1, No. 2, Apr. 2002, pp. 361-368.

Choi et al., "MISO CDMA Transmission with Simplified Receiver for Wireless Communication Handsets", IEEE Transactions of Communications, vol. 49, No. 5, May 2002.

Chuah et al., "Capacity of Multi-Antenna Array Systems in Indoor Wireless Environment", Nov. 1998, IEEE Globecom.

Golden et al., "Detection Algorithm and Initial Laboratory Results Using V-Blast Space-Time Communication Architecture", Electronic Letters, Jan. 7, 1999, vol. 35, No. 1.

Golden et al., "V-Blast: A High Capacity Space- Time Architecture for the Rich-Scattering Wireless Channel", Bell Laboratories, Lucent Technologies, Proc. Int'l Symposium on Advanced Radio Technologies, Boulder, CO, Sep. 10, 1998.

Golub et al., Matrix Computation, "7.3 Power Iterations", The Johns Hopkins University Press, Second Edition, pp. 351, (1983).

Heath et al., "A Simple Scheme for Transmit Diversity Using Partial Channel Feedback", Systems & Computers, Conference Record of the Thirty-Second Asilomar Conferece, Nov. 1-4, 1998; vol. 2; pp. 1073-1078.

Irmer et al., "MISO Concepts for Frequency-Selective Channels", 2002 International Zurich Seminar on Broadband Communications Access, Feb. 19-21. 2002.

Iserte et al., "Iterative Algorithm for the Estimation of Distributed Sources Localization Parameters", SSP 2001, 11th IEEE Workshop on Statistical Signal Processing, Aug. 2001.

Iserte et al., "Joint Beamforming Strategies in OFDM-MIMO Systems", ICASSP 2002, IEEE International Conference on Acoustics, Speech and Signal Processing, May 2002.

Iserte et al., "Pre-and Post-Beamforming in MIMO Channels Applied to HIPERLAN/2 and OFDM", IST Summit 2001, IST Mobile Communications Summit, Sep. 2001.

Ivrlac et al., "On Channel Capacity of Correlated MIMO Channels", ITG Fokusprojekt: Mobilkommunikation "Systeme mit Intelligenten Antennen", IImenau, 2001.

Jakes, "Microwave Mobile Communications", Copyright 1974, pp. 313-320 and pp. 489-498.

Jungnickel et al., "A MIMO WLAN Based on Linear Channel Inversion", IEE Seminar-MIMO Communication Systems from Concept To Implementation, Dec. 2001, pp. 20/1-20/6.

Jungnickel et al., "Performance of a MIMO System with Overlay Pilots", IEEE GlobeCom 2001, pp. 594-598.

Junqiang et al., "Spatial Multiuser Access with MIMO Smart Antennas for OFDM Systems", IEEE VTC 2001, Sep. 2001, pp. 1553-1557.

LAN Man Standards Committee Of The IEEE Computer Society, "Information Technology- Telecommunications and Information Exchange Between Systems— Local and Metropolitan Area Networks —Specific Requirements—Part 11: Wireless LAN Medium Access Control (MAC) And Physical Layer (PHY) Specifications", ANSI/IEEE Sid 802.11, 1999 Edition (R2003), ( Reaffirmed 12 June 2003).

Lee et al., "Antenna Diversity for an OFDM System in a Fading Channel", Proceeding of IEEE MILCOM 1999, Nov. 1999, pp. 1004-1009.

Li et al., "Adaptive Antenna Arrays for OFDM Systems With Cochannel Interference", IEEE Transactions On Communications, vol. 47, No. 2, pp. 217-229, (Feb. 1999).

Love et al., "Equal Gain Transmission in Multiple-Input Multiple-Output Wireless Systems", Nov. 2002, Proceedings of IEEE Globecom, pp. 1124-1128.

Lucent Technologies, "Lucent Technologies: Chips Posied to Bring 'BLAST' Multiple Input/Multiple Output Technology to Laptops, PDAs and Other Mobile Devices", Oct. 16, 2002, lucent.com.

Meyer-Ottens, et al., "Downlink Beamforming for W-CDMA Using Feedback and Interference Estimate", Mar. 9, 2001.

Morgan, "Interaction of Adaptive Antenna Arrays in an Arbitrary Environment", The Bell System Technical Journal, Jan. 1965, pp. 23-47.

Narula et al., "Efficent Use of Side Information In Multiple-Antenna Data Transmission Over Fading Channels", IEEE Journal On Selected Areas In Communications, vol. 16, No. 8, pp. 1423-1436, (October 1998).

Onggosanusi et al., "Performance Analysis Of Closed-Loop Transmit Diversity In The Presence Of Feedback Delay", IEEE Transactions On Communications, vol. 49, No. 9, pp. 1618-1630, (Sep. 2001).

Raleigh et al., "Spatio-Temporal Coding for Wireless Communication", IEEE Transactions on Communications, vol. 46, No. 3, Mar. 19998, pp. 357-366.

Sanchez et al., "CSMA/CA Beam Forming Antennas in Multi-hop Packet Radio"; Proc. For Swedish Workshop on Wireless Ad-Hoc Networks, Mar. 5-6, 2001.

Stridh et al., "MIMO Channel Capacity on a Measured Indoor Radio Channel at 5.8 GHz", Proc. of the Asilomar Conf. on Signals, Systems & Computers, vol. 1, Oct. 2000, pp. 733-737.

Stridh et al., "Spatial Characterization of Indoor Radio Channel Measurements at 5 GHz", SAM 2000, Mar. 2000, pp. 58-62.

Vaidyanathan et al., "The Role in Lossless Systems in Modern Digital Signal Processing: A Tutorial", IEEE Transactions on Education, vol. 32, Aug. 1989, pp. 181-197.

Wallace et al., "Experimental Characterization of the MIMO Wireless Cannel: Data Acquisition and Analysis", Feb. 27, 2002, Department of Electrical and Computer Engineering, Brigham Young University.

Wennström et al., "On The Optimality And Performance Of Transmit And Receive Space Diversity In MIMO Channels", IEEE Seminar on Communications Systems form Concept to Implementations, (Dec. 12, 2001).

Wolniansky et al., "V-BLAST: An Architecture for Realizing Very High Data Rates Over the Rich-Scattering Wireless Channel", Proc. ISSSE-98, Pisa, Italy, Sep. 29, 1998.

Yang et al., "Joint Transmitter—Receiver Optimization for Multi-Input Multi-Output Systems With Decision Feedback", IEEE Transactiosn On Information Theory, vol. 40, No. 5, pp. 1334-1347, (September 1994).

Yang et al., "On Joint Transmitter and Receive Optimization for Multiple-Input-Multiple-Output (MIMO) Transmission Systems", IEEE Transactions on Communications, vol. 42, No. 12, Dec. 1994.

Yeh, "An Analysis of Adaptive Retransmission Arrays in a Fading Environment ", The Bell System Technical Journal, Oct. 1970, pp. 1811-1825.

Chang et al., "Joint Transmitter Receiver Diversity For Efficient Space Division Multiaccess", IEEE Transactions on Wireless Communications, vol. 1, No. 1, Jan. 2002.

Sampath et al., "Joint Transmit And Receive Optimization For High Data Rate Wireless Communication Using Multiple Antennas", Signals, Systems, and Computers, vol. 1, Oct. 1999.

Haardt et al., "Smart Antennas For UTRA TDD", European Transactions On Telecommunications vol. 12, No. 5, Sep. 2001.

Lucent Technologies, "Lucent technologies: Chips poised to bring 'BLAST' Multiple Input/Multiple Output Technology to Laptops, PDAs and Other Mobile Devices", Oct. 16, 2002, lucent.com.

Meyer-Ottens, et al. "Downlink Beamforming for W-CDMA Using Feedback and Interference Estimate", Mar. 9, 2001.

Narula et al., "Efficient Use Of Side Information In Multiple-Antenna Data Transmission Over Fading Channels", IEEE Journal On Selected Areas In Communications, vol. 16, No. 8, pp. 1423-1436, (Oct. 1998).

Perahia et al., "Adaptive Antenna Arrays and Equilization for Indoor Digital Radio," IEEE International Conference on Communications, pp. 592-596 (Jun. 1996).

Siwiak, "Radiowave Propagation and Antennas for Personal Communications," Artech House, Inc., pp. 31-37 (Apr. 1998).

Wallace et al., "Experimental Characterization of the MIMO Wireless Channel: Data Acquisition and Analysis", Feb. 27, 2002, Department of Electrical and Computer Engineering, Brigham Young University.

SYSTEM AND METHOD FOR ANTENNA DIVERSITY USING EQUAL POWER JOINT MAXIMAL RATIO COMBINING

This application is a continuation of U.S. application Ser. No. 10/800,610, filed Mar. 15, 2004, which is a continuation of U.S. application Ser. No. 10/174,689, filed Jun. 19, 2002, pending, which in turn claims priority to U.S. Provisional Application No. 60/361,055, filed Mar. 1, 2002, to U.S. Provisional Application No. 60/365,797 filed Mar. 21, 2002, and to U.S. Provisional Application No. 60/380,139, filed May 6, 2002. The entirety of each of the aforementioned applications are incorporated herein by reference.

BACKGROUND OF THE INVENTION

The present invention is directed to an antenna (spatial) processing useful in wireless communication applications, such as short-range wireless applications.

Composite Beamforming (CBF) is an antenna processing technique in which a first communication device, having a plurality of antennas, weights a signal to be transmitted by its antennas to a second communication device also having a plurality of antennas. Similarly, the second communication device weights and combines the received signals received by its antennas. A multiple-input/multiple-output (MIMO) optimized communication system is defined by CBF. The transmit weights and receive weights are determined to optimize the link margin between the devices, thereby significantly extending the range of communication between the two communication devices. Techniques related to composite beamforming are the subject matter of above-identified commonly assigned co-pending application.

There is room for still further enhancing this CBF technique to optimize cost and implementation issues at the expense of only slight degradation in performance. Such a solution is extremely valuable in manufacturing a cost-effective integrated circuit solution.

SUMMARY OF THE INVENTION

An equal gain composite beamforming technique is provided that adds the constraint that the power of the signal output by each of the plurality of transmit antennas is the same, and is equal to the total power of the transmit signal divided by the number N of transmit antennas from which the signal is to be transmitted. This reduces output power requirements at each antenna. By reducing output power requirements for each power amplifier, the silicon area of the power amplifiers are reduced by as much as N times (where N is the number of transmit antennas) relative to non-equal gain CBF. Many implementation advantages are achieved by equal gain CBF, including savings in silicon, power requirements, etc.

The above and other objects and advantages will become more readily apparent when reference is made to the following description taken in conjunction with the accompanying drawings.

DETAILED DESCRIPTION OF THE DRAWINGS

Figure 1:
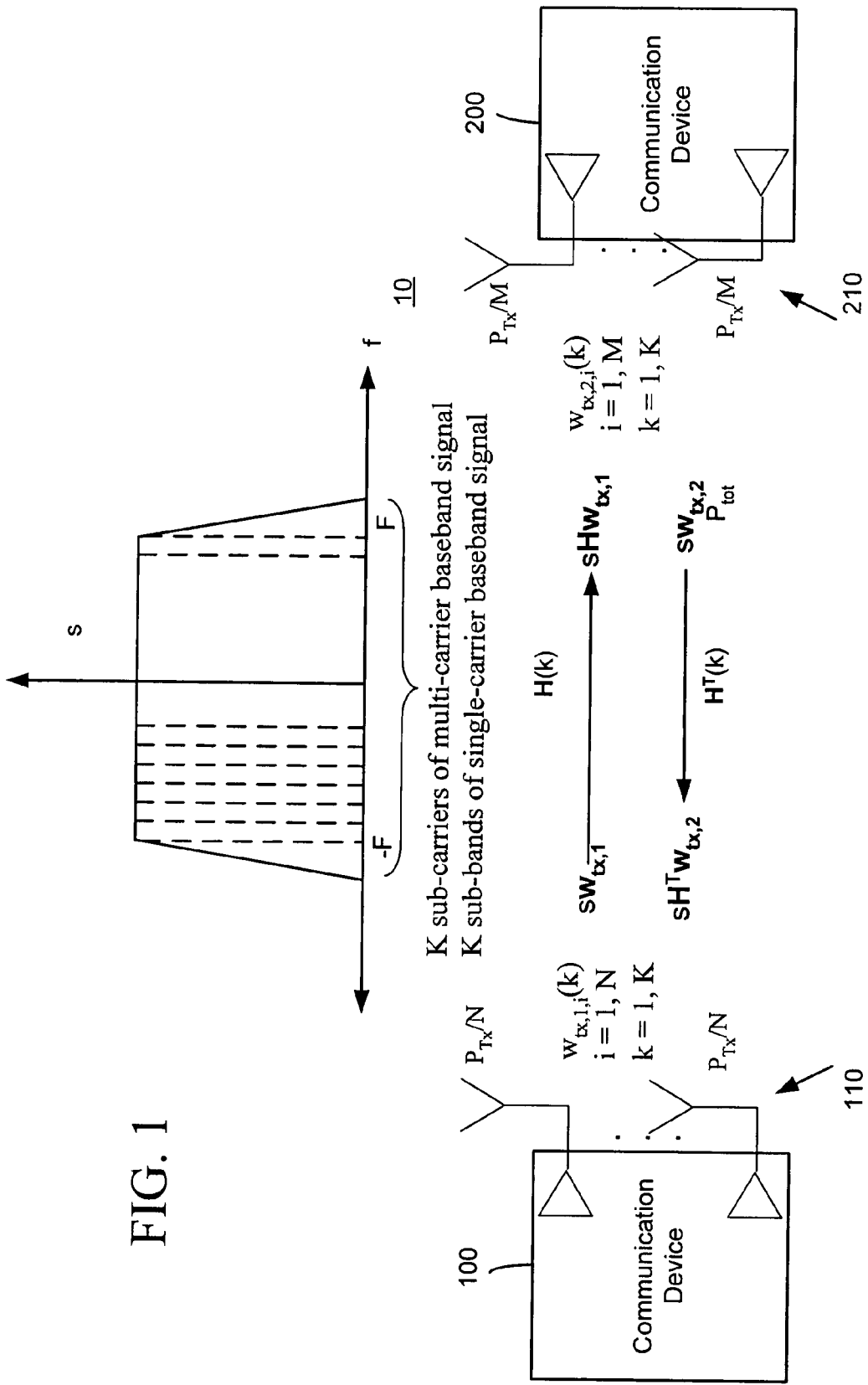
FIG. 1 is a block diagram of two communication devices performing equal gain composite beamforming.

Referring first to FIG. 1, a system 10 is shown in which a first communication device and a second communication device 200 communicate with each other using radio frequency (RF) communication techniques. The devices use composite beamforming techniques when communicating with each other. In particular, communication device 100 has N plurality of antennas 110 and communication device 200 has M plurality of antennas 210. According to the composite beamforming (CBF) technique also described in the aforementioned co-pending application filed on even date, when communication device 100 transmits a signal to communication device 200, it applies to (i.e., multiplies or scales) a baseband signal s to be transmitted a transmit weight vector associated with a particular destination device, e.g., communication device 200, denoted $w_{tx,1}$. Similarly, when communication device 200 transmits a baseband signal s to communication device 100, it multiplies the baseband signal s by a transmit weight vector $w_{tx,2}$, associated with destination communication device 100. The (M×N) frequency dependent channel matrix from the N plurality of antennas of the first communication device 100 to M plurality of antennas of the second communication device 200 is H(k), and the frequency dependent communication channel (N×M) matrix between the M plurality of antennas of the second communication device and the N plurality of antennas of the first communication device is $H^T(k)$.

The transmit weight vectors $w_{tx,1}$ and $w_{tx,2}$ each comprises a plurality of transmit weights corresponding to each of the N and M antennas, respectively. Each transmit weight is a complex quantity. Moreover, each transmit weight vector is frequency dependent; it may vary across the bandwidth of the baseband signal s to be transmitted. For example, if the baseband signal s is a multi-carrier signal of K sub-carriers, each transmit weight for a corresponding antenna varies across the K sub-carriers. Similarly, if the baseband signal s is a single-carrier signal (that can be divided or synthesized into K frequency sub-bands), each transmit weight for a corresponding antenna varies across the bandwidth of the baseband signal. Therefore, the transmit weight vector is dependent on frequency, or varies with frequency sub-band/sub-carrier k, such that wtx becomes $w_{tx}(f)$, or more commonly referred to as $w_{tx}(k)$, where k is the frequency sub-band/sub-carrier index.

While the terms frequency sub-band/sub-carrier are used herein in connection with beamforming in a frequency dependent channel, it should be understood that the term "sub-band" is meant to include a narrow bandwidth of spectrum forming a part of a baseband signal. The sub-band may be a single discrete frequency (within a suitable frequency resolution that a device can process) or a narrow bandwidth of several frequencies.

The receiving communication device also weights the signals received at its antennas with a receive antenna weight vector $w_{rx}(k)$. Communication device 100 uses a receive antenna weight vector $w_{rx,1}(k)$ when receiving a transmission from communication device 200, and communication device 200 uses a receive antenna weight vector $w_{rx,2}(k)$ when receiving a transmission from communication device 100. The receive antenna weights of each vector are matched to the received signals by the receiving communication device. The receive weight vector may also be frequency dependent.

Generally, transmit weight vector $w_{tx,1}$ comprises a plurality of transmit antenna weights $w_{tx,1,i} = \beta_{1,i}(k)e^{i\phi 1,i,(k)}$, where $\beta_{1,i}(k)$ is the magnitude of the antenna weight, $\phi 1,i,(k)$ is the phase of the antenna weight, i is the antenna index, and k is the frequency sub-band or sub-carrier index (up to K frequency sub-bands/sub-carriers). The subscripts tx,1 denote that it is a vector that communication device 100 uses to transmit to communication device 2. Similarly, the subscripts tx,2 denote that it is a vector that communication device 200 uses to transmit to communication device 100.

Under the constraint of an equal gain composite beamforming (EGCBF) process, the power of the transmit signal output by each transmit antenna is the same, and is equal to the total power associated with the transmit signal ($P_{tx}$) divided by the number of transmit antennas. Thus, for communication device 100, that is $P_{tx}/N$. For communication device 200, that is $P_{tx}/M$. Consequently, each power amplifier associated with an antenna need only support 1/N of the total output power. Example: For N=4, $P_{tx}$=17 dBm, each power amplifier need only support a max linear output power of 17−10log(4)=11 dBm. Thus, whereas for non-equal gain composite beamforming each power amplifier must support the total transmit power, such is not the case for equal gain beamforming. The equal-gain constraint makes the power amplifier design much simpler. Equal gain CBF performs very close to non-equal gain CBF (within 1-2 dB), but costs significantly less to implement in terms of power amplifier requirements and affords the opportunity to deploy the power amplifiers on the same silicon integrated circuit as the RF circuitry.

When considering a frequency dependent communication channel, the EGCBF constraint implies that for each and every antenna i, the sum of the power $|w_{tx,i}(k)|^2$ of the antenna signal across all of frequencies of the baseband signal (the frequency sub-bands or sub-carrier frequencies k=1 to K) is equal to $P_{tx}/N$. This is the equal gain constraint applied to a frequency dependent channel represented by K sub-carrier frequencies or frequency sub-bands.

An additional constraint can be imposed on the frequency dependent equal gain constraint explained above. This additional constraint is a frequency shaping constraint which requires that at each frequency of the baseband signal to be transmitted (e.g., frequency sub-band or frequency sub-carrier k), the sum of the power of signals across all of the transmit antennas ($|w_{tx,i}(k)|^2$ for i=1 to N) is equal to $P_{tx}/K$. This constraint is useful to ensure that, in an iterative process between two communication devices, the transmit weights of the two devices will converge to optimal values. An additional benefit of this constraint is that the transmitting device can easily satisfy spectral mask requirements of a communication standard, such as IEEE 802.11x.

One solution to a system that combines the frequency selective equal gain constraint and the frequency shaping constraint is that $|w_{tx,i}(k)|^2 = P_{tx}/(KN)$. This solution says that the magnitude of each transmit antenna weight is $P_{tx}/(KN)$. If the transmit weight vector is normalized to unity, i.e., divided by $[P_{tx}/(KN)]^{1/2}$, then the vectors for all of the antennas across all of the k frequency sub-bands becomes a N×K matrix of phase values $e^{i\Phi ik}$, where i is the antenna index and k is the sub-band/sub-carrier index.

$$\begin{matrix} e^{j\varphi 11} & e^{j\varphi 21} & e^{j\varphi 31} & \ldots & e^{j\varphi N1} \\ e^{j\varphi 12} & & & & e^{j\varphi N2} \\ e^{j\varphi 13} & & & & e^{j\varphi N3} \\ \ldots & & & & \ldots \\ e^{j\varphi 1K} & e^{j\varphi 2K} & e^{j\varphi 3K} & \ldots & e^{j\varphi NK} \end{matrix}$$

Figure 2:
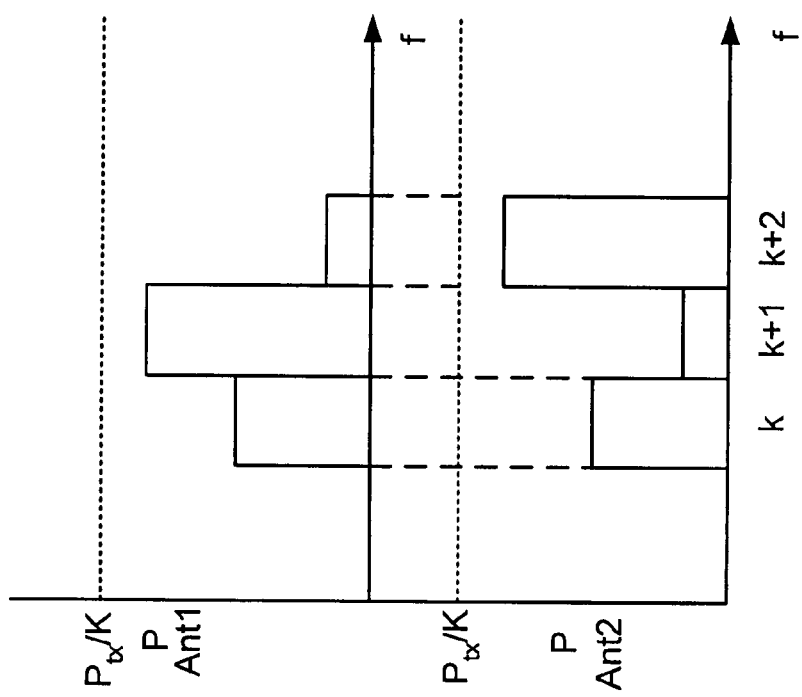
FIG. 2 shows frequency dependent weights for two antennas that are frequency shaped, but not equal gain.

FIG. 2 shows the magnitude of the antenna weights in a 2-antenna example that satisfy the frequency shaping constraint but not the equal gain constraint. The magnitude of the antenna weights for the two antennas at each of three exemplary frequency sub-bands (k, k+1, k+2) are shown. The sum of the magnitude of the antenna weights of both antennas at any of the frequency sub-bands shown adds to a constant value, $P_{tx}/K$.

Figure 3:
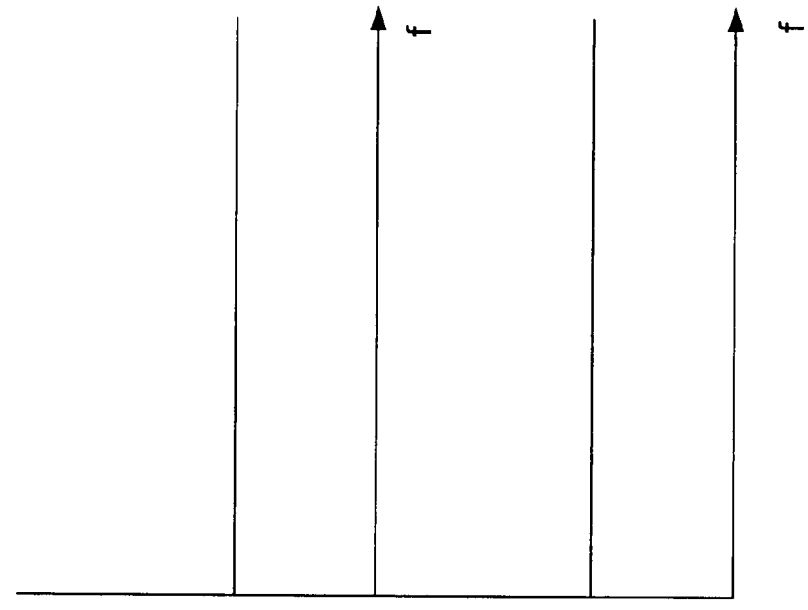
FIG. 3 shows equal gain frequency dependent weights for two antennas.

FIG. 3 shows the magnitude of the antenna weights in the 2-antenna example that satisfy the equal gain constraint and the frequency shaping constraint. In this example, the total power at antenna 1 (i.e., the total area under the weight curve across k frequency sub-bands) is P/2 (N=2 in the example) and the total power of the antennas at any frequency sub-band k is P/K. Thus, the power or magnitude of the transmit antenna weight for any given antenna is equal (constant) across the bandwidth of the baseband signal, and is equal to P/(KN) for all k. In other words, at each antenna, the power is equally distributed across the bandwidth of the baseband signal.

For EGCBF, the optimization problem becomes $$\operatorname{argmax}\{w^H_{tx,1}(k)H^H(k)H(k)w_{tx,1}(k)\}, \quad \text{subject to} \quad |w_{tx,i}(k)|^2 = P_{tx}/(NK). \tag{1}$$

A closed-form solution to equation (1) is difficult to obtain since it requires the solution of a non-linear system of equations. However, the following necessary conditions for the solution to (1) have been derived and are given below:

Optimal $w_{rx}$ satisfies $w_{rx}=kHw_{tx}$ for some nonzero constant k.

Optimal $w_{tx}$ satisfies $\operatorname{Im}(\Lambda^* H^H H e^{i\Phi})=0$, $\Lambda=\operatorname{diag}(e^{i\Phi 0}, e^{i\Phi 1}, \ldots, e^{i\Phi N-1})$, $w_{tx}=e^{i\Phi}=(e^{i\Phi 0}, e^{i\Phi 1}, \ldots, e^{i\Phi N-1})^T$. One solution to equation (1) is an adaptive algorithm for EGCBF. Although the algorithm is not necessarily optimal in terms of solving equation (1), it is simple to implement and simulations have verified that it converges reliably at the expense of only a 1-2 dB performance penalty relative to non-equal gain CBF. This adaptive algorithm is described hereinafter in conjunction with FIG. 5.

Figure 4:
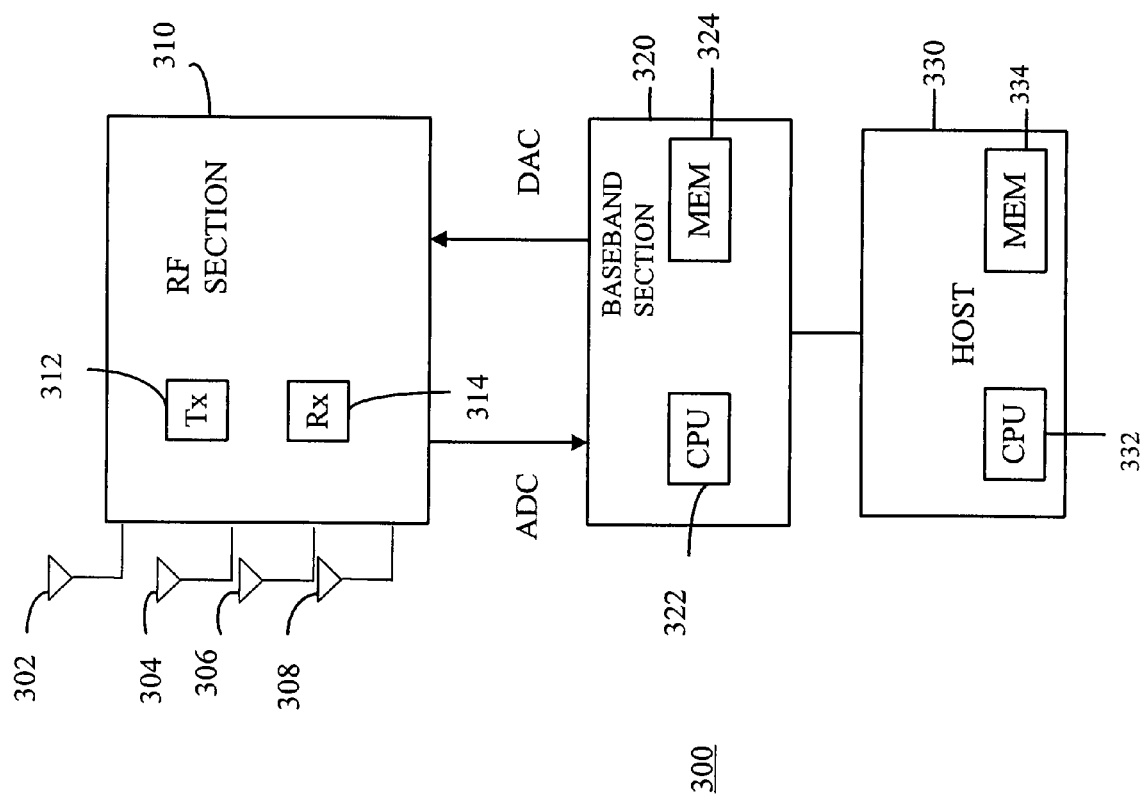
FIG. 4 is a block diagram of a communication device capable of performing equal gain composite beamforming.

The communication devices at both ends of the link, i.e., devices 100 and 200 may have any known suitable architecture to transmit, receive and process signals. An example of a communication device block diagram is shown in FIG. 4. The communication device 300 comprises an RF section 310, a baseband section 420 and optionally a host 330. There are a plurality of antennas, e.g., four antennas 302, 304, 306, 308 coupled to the RF section 310 that are used for transmission and reception. The device may have only two antennas. The RF section 310 has a transmitter (Tx) 312 that upconverts baseband signals for transmission, and a receiver (Rx) 314 that downconverts received RF signals for baseband processing. In the context of the composite beamforming techniques described herein, the Tx 312 upconverts and supplies separately weighted signals to corresponding ones of each of the plurality of antennas via separate power amplifiers for simultaneous transmission. Similarly, the Rx 314 downconverts and supplies received signals from each of the plurality of antennas to the baseband section 320. The baseband section 320 performs processing of baseband signals to recover the information from a received signal, and to convert information in preparation for transmission. The baseband section 320 may implement any of a variety of communication formats or standards, such as WLAN standards IEEE 802.11x, Bluetooth™, as well as other standards.

The intelligence to execute the computations for the composite beamforming techniques described herein may be implemented in a variety of ways. For example, a processor 322 in the baseband section 320 may execute instructions encoded on a processor readable memory 324 (RAM, ROM, EEPROM, etc.) that cause the processor 322 to perform the composite beamforming steps described herein. Alternatively, an application specific integrated circuit (ASIC) may be configured with the appropriate firmware, e.g., field programmable gates that implement digital signal processing instructions to perform the composite beamforming steps. This ASIC may be part of, or the entirety of, the baseband section 320. Still another alternative is for the beamforming computations to be performed by a host processor 332 (in the host 330) by executing instructions stored in (or encoded on) a processor readable memory 334. The RF section 310 may be embodied by one integrated circuit, and the baseband section 320 may be embodied by another integrated circuit. The communication device on each end of the communication link need not have the same device architecture or implementation.

Regardless of the specific implementation chosen, the composite beamforming process is generally performed as follows. A transmit weight vector (comprising a plurality of complex transmit antenna weights corresponding to the number of transmit antennas) is applied to, i.e., scaled or multiplied by, a baseband signal to be transmitted, and each resulting weighted signal is coupled to a transmitter where it is upconverted, amplified and coupled to a corresponding one of the transmit antennas for simultaneous transmission. At the communication device on the other end of the link, the transmit signals are detected at each of the plurality of antennas and downconverted to a baseband signal. Each baseband signal is multiplied by a corresponding one of the complex receive antenna weights and combined to form a resulting receive signal. The architecture of the RF section necessary to accommodate the beamforming techniques described herein may vary with a particular RF design, and many are known in the art and thus is not described herein.

Figure 5:
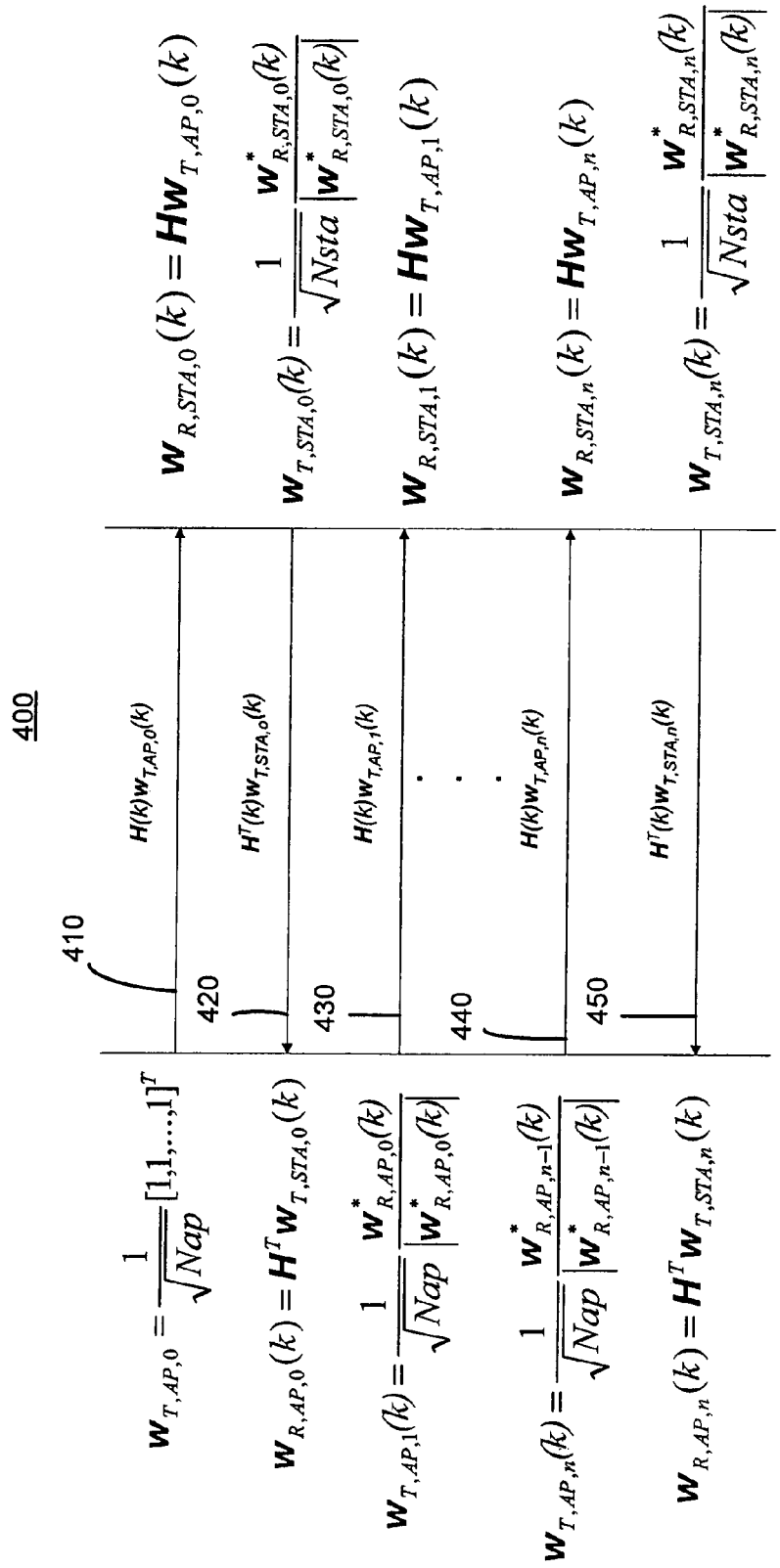
FIG. 5 is a flow diagram showing an adaptive algorithm to obtain equal gain transmit antenna weights for first and second communication devices in communication with each other.

With reference to FIG. 5, an adaptive procedure 400 for determining near optimum transmit antenna weight vectors for first and second communication devices will be described. The antenna weight parameters in FIG. 4 are written with indexes to reflect communication between a WLAN access point (AP) and a station (STA), but without loss of generality, it should be understood that this process is not limited to WLAN application, but is useful in any short-range wireless application. The AP has Nap antennas and the STA has Nsta antennas. Assuming the AP begins with a transmission to the STA, the initial AP transmit weight vector $w_{T,AP,0}(k)$ is [1,1, ... 1], equal gain and normalized by $1/(Nap)^{1/2}$ for all antennas and all frequency sub-bands/sub-carriers k. Phase for the transmit antenna weights is also initially set to zero. The index T indicates it is a transmit weight vector, index AP indicates it is an AP vector, index 0 is the iteration of the vector, and (k) indicates that it is frequency sub-band/sub-carrier dependent. The index i is the antenna index. The transmit weight vectors identified in FIG. 5 form an N x K matrix explained above.

In step 410, a baseband signal is scaled by the initial AP transmit weight vector $w_{T,AP,0}(k)$, upconverted and transmitted to the STA. The transmitted signal is altered by the frequency dependent channel matrix H(k) from AP-STA. The STA receives the signal and matches its initial receive weight vector $w_{R,STA,0}(k)$ to the signals received at its antennas. In step 420, the STA gain normalizes the receive weight vector $w_{R,STA,0}(k)$ and computes the conjugate of gain-normalized receive weight vector to generate the STA's initial transmit weights for transmitting a signal back to the AP. The STA scales the signal to be transmitted to the AP by the initial transmit weight vector, upconverts that signal and transmits it to the AP. Computing the conjugate for the gain-normalized vector means essentially co-phasing the receive weight vector (i.e., phase conjugating the receive weight vector). The transmitted signal is effectively scaled by the frequency dependent channel matrix $H^T(k)$. At the AP, the receive weight vector is matched to the signals received at its antennas. The AP then computes the conjugate of the gain-normalized receive weight vector as the next transmit weight vector $w_{T,AP,1}(k)$ and in step 430 transmits a signal to the STA with that transmit weight vector. The STA receives the signal transmitted from the AP with this next transmit weight vector and matches to the received signals to compute a next receive weight vector $w_{R,STA,1}(k)$. Again, the STA computes the conjugate of the gain-normalized receive weight vector $w_{R,STA,1}(k)$ as its next transmit weight vector $w_{T,STA,1}(k)$ for transmitting a signal back to the AP. This process repeats for several iterations, ultimately converging to transmit weight vectors that achieve nearly the same performance as non-equal gain composite beamforming. This adaptive process works even if one of the devices, such as a STA, has a single antenna for transmission and reception. In addition, throughout the adaptive process, the frequency shaped constraint may be maintained so that for each antenna, the transmit antenna weight is constant across the bandwidth of the baseband signal.

Figure 6:
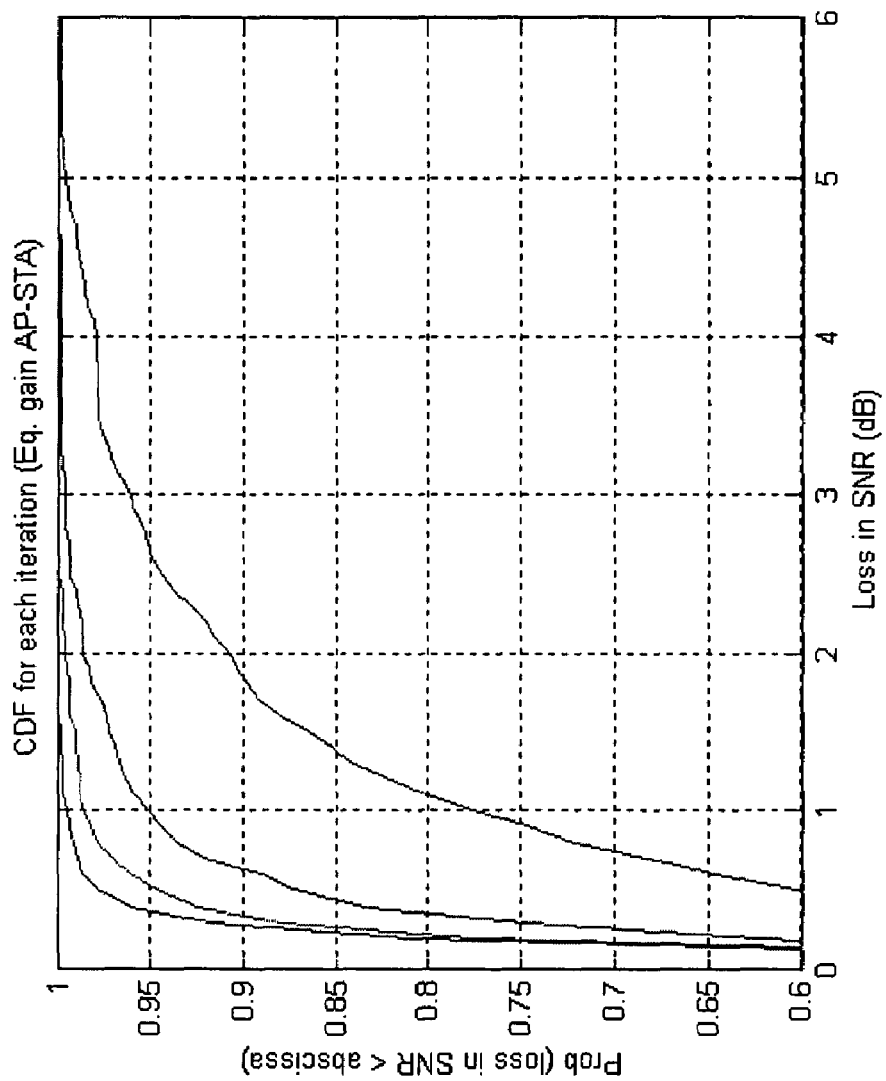
FIG. 6 is a graphical diagram illustrating convergence of the adaptive algorithm shown in FIG. 5
Figure 7:
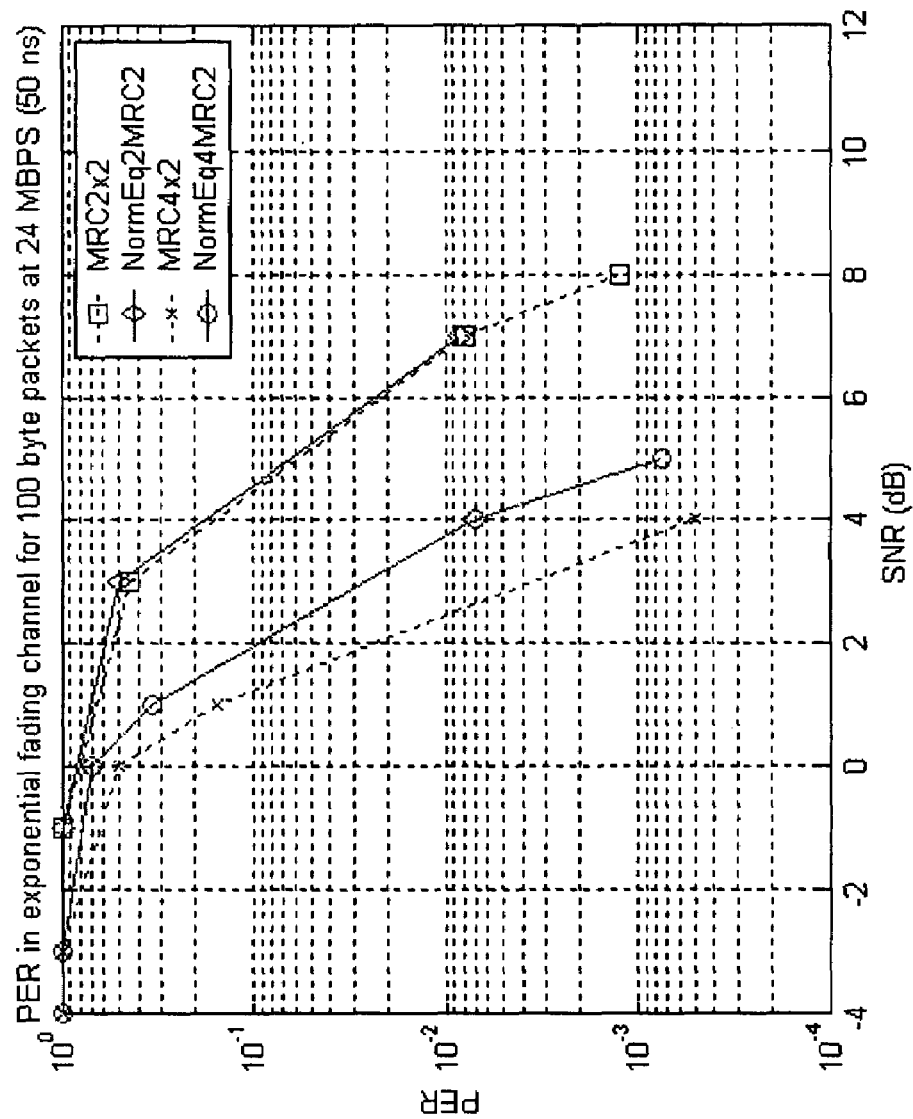
FIG. 7 is a graphical diagram illustrating a performance comparison between equal gain composite beamforming and non-equal gain composite beamforming.

FIG. 6 shows that the adaptive algorithm converges to performance loss that is less than 1 dB with 95% probability after 3-4 iterations. FIG. 7 shows simulation results that indicate that the performance degradation compared to the non-equal gain composite beamforming case is only 1-2 dB.

Each communication device stores the transmit antenna weights determined to most effectively communicate with each of the other communication devices that it may communicate with. The transmit antenna weights may be determined according to the adaptive algorithm described above. When storing the transmit weights of a transmit weight vector, in order to conserve memory space in the communication device, the device may store, for each antenna, weights for a subset or a portion of the total number of weights that span the bandwidth of the baseband signal. For example, if there are K weights for K frequency sub-bands or sub-carrier frequencies, only a sampling of those weights are actually stored, such as weights for every other, every third, every fourth, etc., k sub-band or sub-carrier. Then, the stored subset of transmit weights are retrieved from storage when a device is to commence transmission of a signal, and the remaining weights are generated by interpolation from the stored subset of weights. Any suitable interpolation can be used, such as linear interpolation, to obtain the complete set of weights across the K sub-bands or sub-carriers for each antenna.

Figure 8:
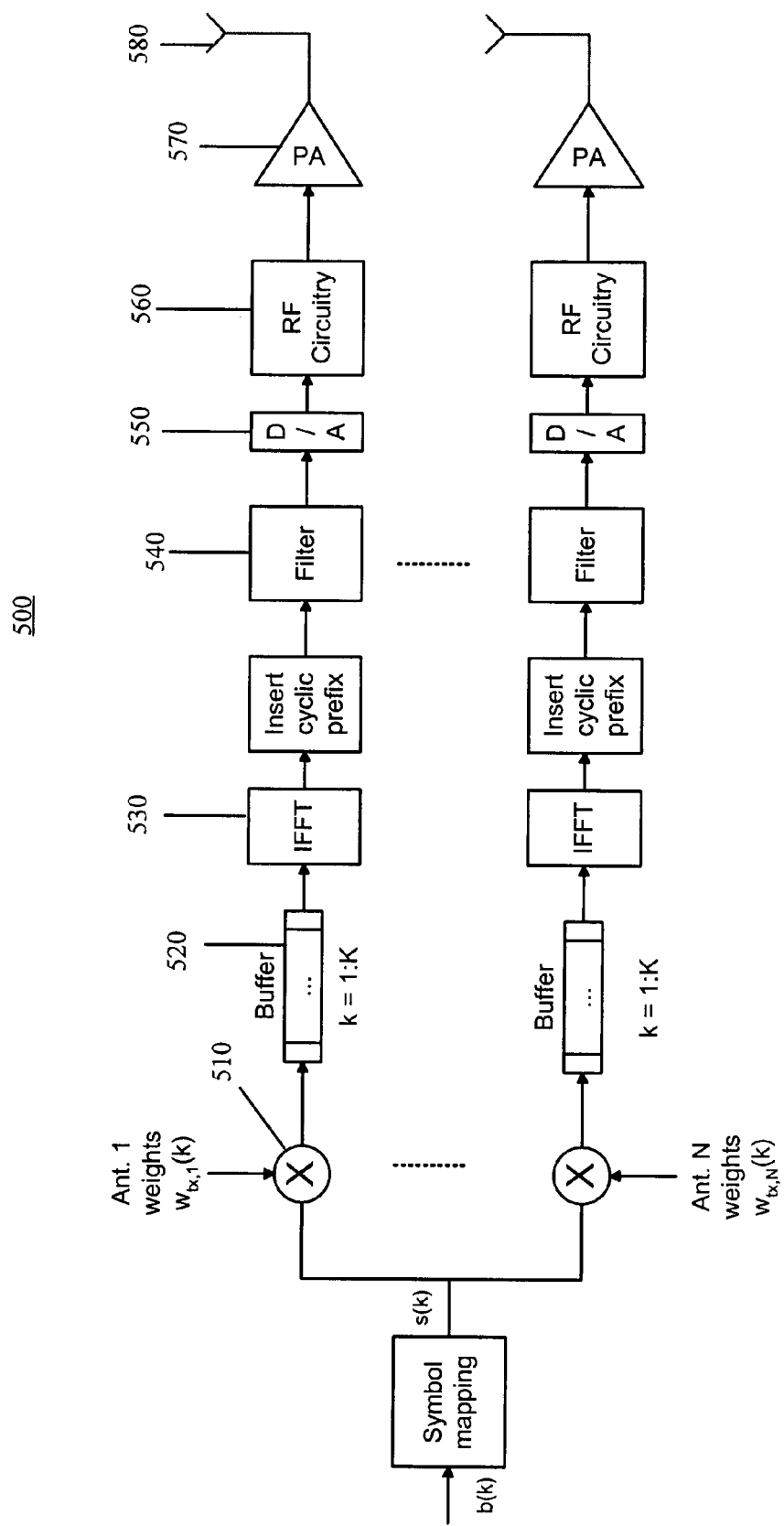
FIG. 8 is a block diagram of a composite beamforming transmission process for a multi-carrier baseband modulation scheme.

With reference to FIG. 8, a beamforming transmission process 500 is shown for a multi-carrier baseband modulation scheme. For a multi-carrier modulation system, such as an orthogonal frequency division multiplexed (OFDM) system used in IEEE 802.11a, the data symbols are in the frequency domain. K symbols are assigned to K sub-carriers (K=52 for 802.11a). For convenience, each of the transmit antenna weights are described as a function of (k), the sub-carrier frequency. The equal gain transmit antenna weights are computed by any of the processes described herein at each of the sub-carrier frequencies. There is a signal processing path for each of the N antennas. In each signal processing path, a multiplier 510 multiplies the frequency domain symbol s(k) by the corresponding equal-gain transmit antenna weight $w_{tx}$(k) and because $w_{tx}$(k) has K values, there are K results from the multiplication process. The results are stored in a buffer 520 for k=1 to K. An inverse Fast Fourier Transform (IFFT) 530 is coupled to the buffer to convert the frequency domain results stored in buffer 520 to a digital time domain signal for each of the K sub-carriers. There may be some adjustment made for cyclic prefixes caused by the OFDM process. A filter 540 provides lowpass filtering of the result of the IFFT process. The digital results of the filtering process are converted to analog signals by a D/A 550. The outputs of the D/A 550 are coupled to RF circuitry 560 that upconverts the analog signals to the appropriate RF signal which is coupled via a power amplifier (PA) 570 to one of the N antennas 580. In this manner, for each antenna 580, the signal s(k) is multiplied by respective transmit antenna weights whose phase values may vary as a function of the sub-carrier frequency k.

Figure 9:
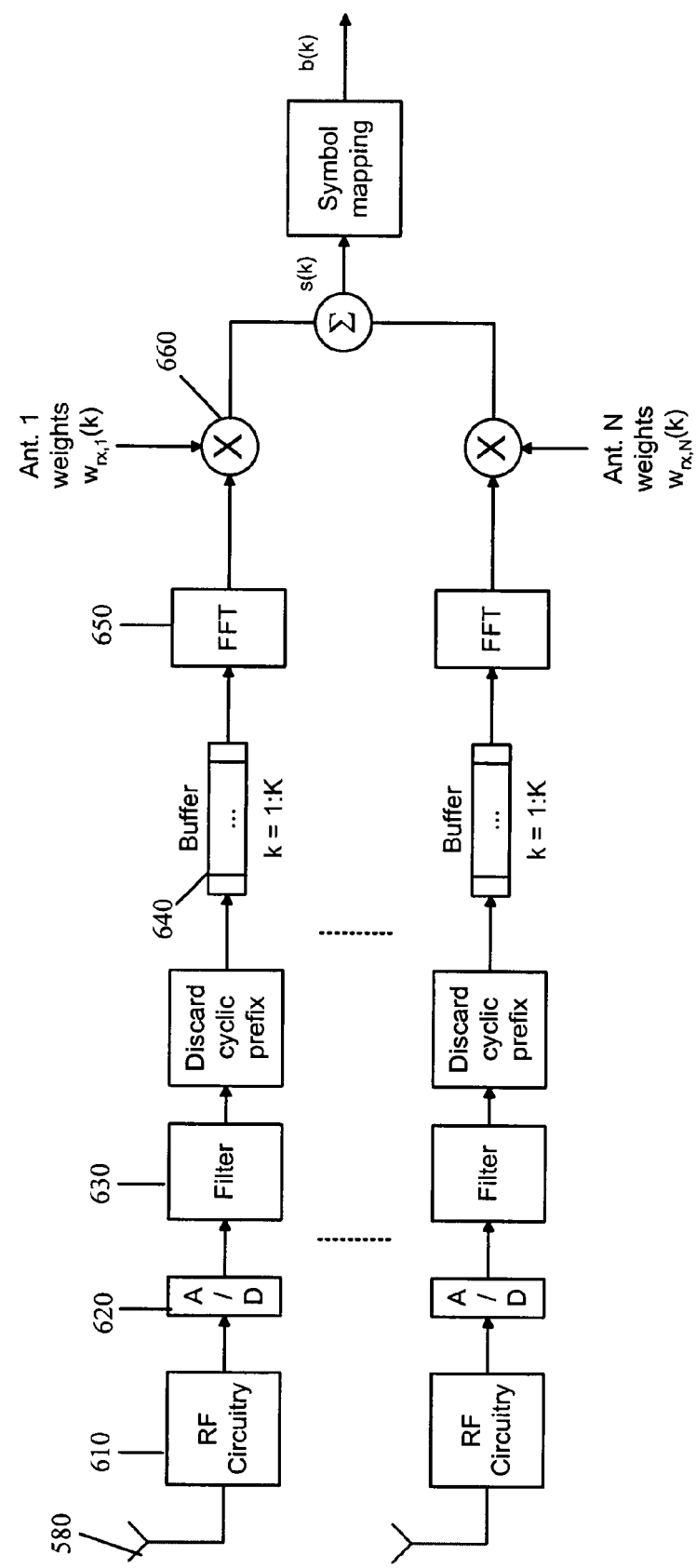
FIG. 9 is a block diagram of a composite beamforming reception process for a multi-carrier baseband modulation scheme.

FIG. 9 shows a reception process 600 that is essentially the inverse of the transmission process 500 shown in FIG. 8. There is a signal processing channel for each of the antennas 580. RF circuitry 610 downconverts the RF signals detected at each antenna 580 for each of the sub-carriers. An A/D 620 converts the analog signal to a digital signal. A lowpass filter 630 filters the digital signal. There may be some adjustment made for cyclic prefixes caused by the OFDM process. A buffer 640 stores the time domain digital signal in slots associated with each sub-carrier frequency k. An FFT 650 converts the time domain digital signal in buffer 640 to a frequency domain signal corresponding to each sub-carrier frequency k. The output of the FFT 650 is coupled to a multiplier 660 that multiplies the digital signal for each sub-carrier k by a corresponding receive antenna weight $w_{rx}$(k) for the corresponding one of the N antennas. The outputs of each of the multipliers 660 are combined by an adder 670 to recover the digital frequency domain symbol s(k). The signal s(k) is then mapped back to symbol b(k).

Figure 10:
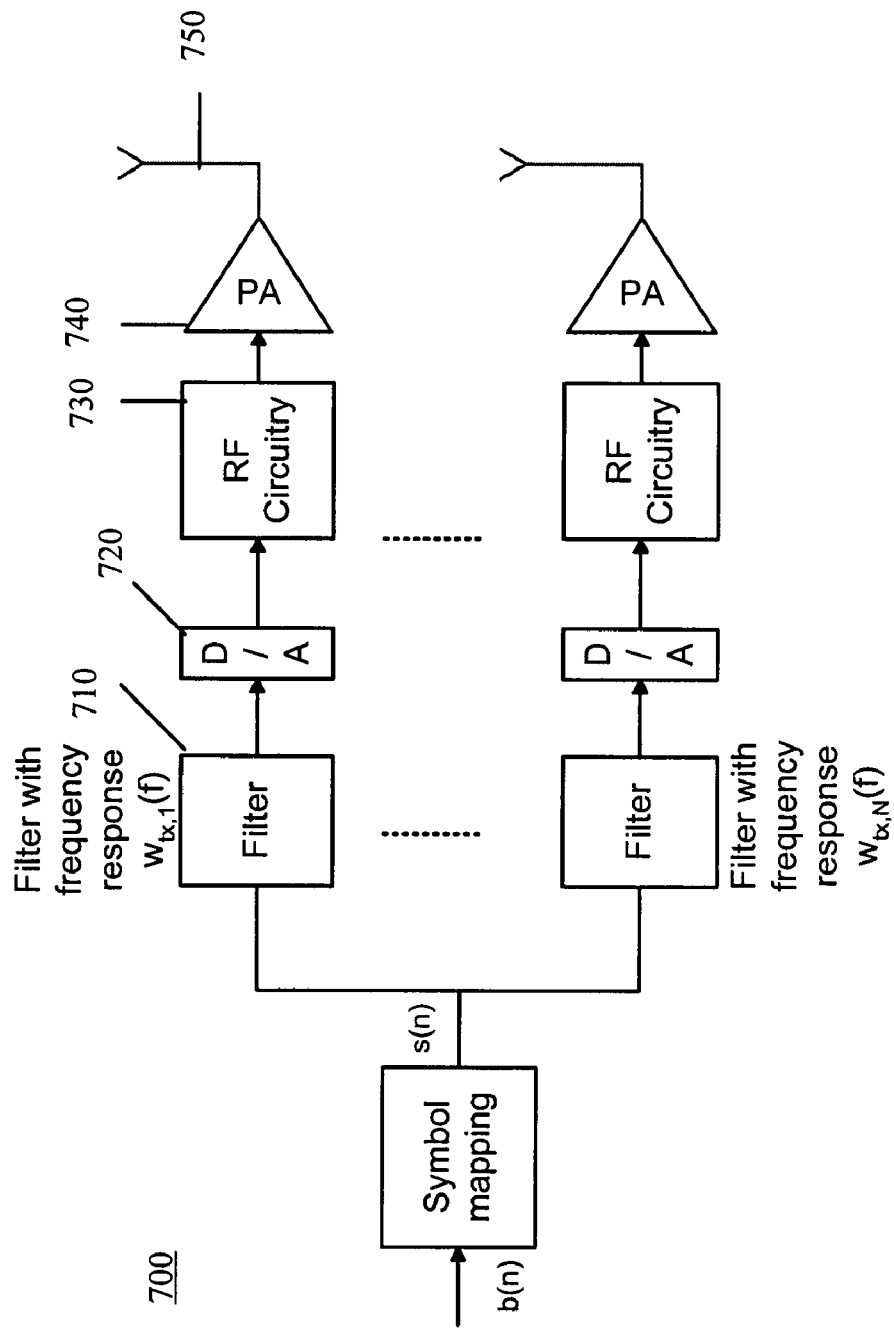
FIG. 10 is a block diagram of a composite beamforming transmission process for a single carrier baseband modulation scheme.
Figure 11:
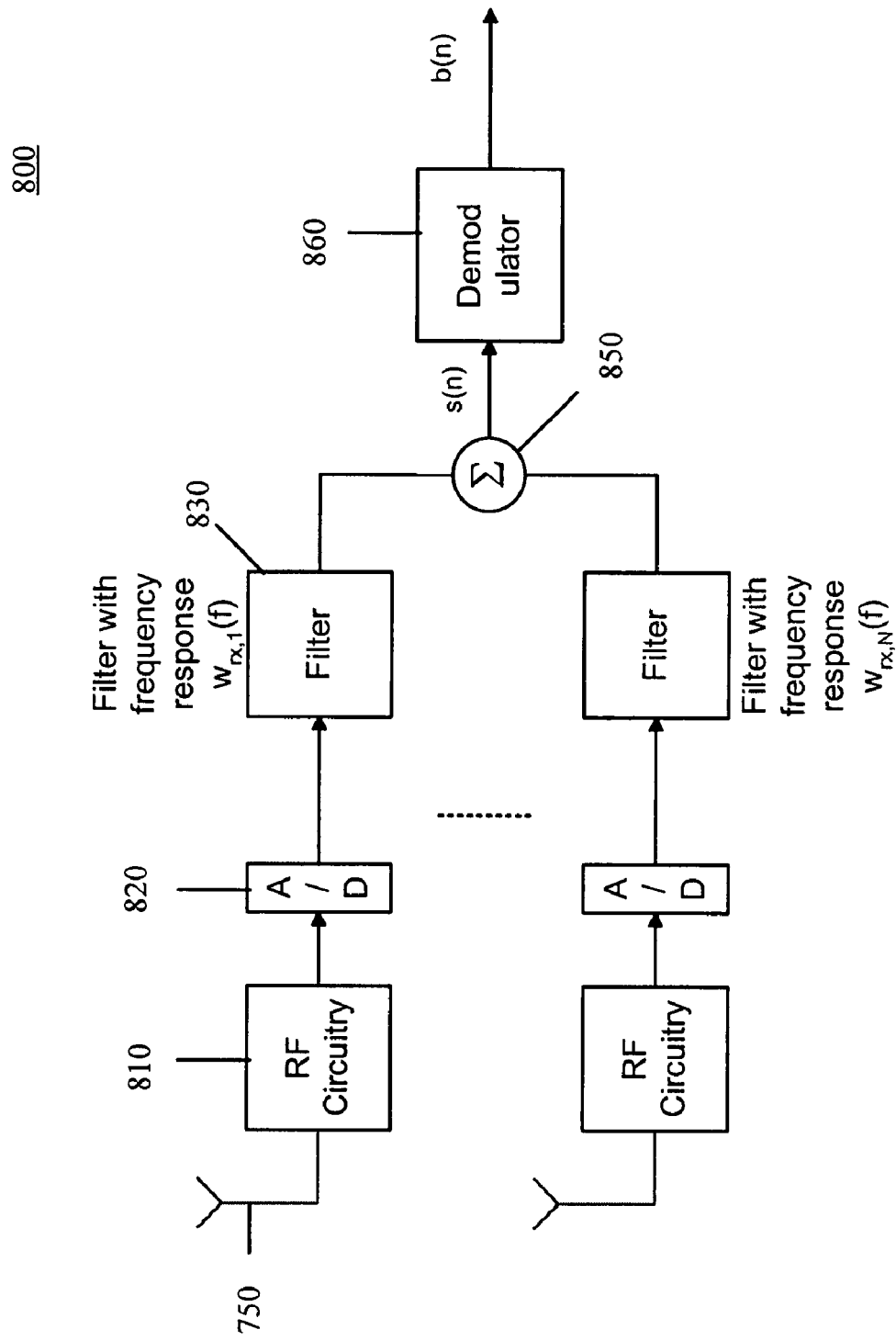
FIG. 11 is a block diagram of a composite beamforming reception process for a single carrier baseband modulation scheme.

FIGS. 10 and 11 show transmission and reception processes, respectively, that are applicable to a single-carrier baseband modulation scheme, such as that used by the IEEE 802.11b standard. The data symbols in such a system are m the time domain. FIG. 10 shows a beamforming transmission process 700. Since in a frequency dependent channel, the transmit antenna weights are frequency dependent, the passband of the time-domain baseband signal is synthesized into frequency bins or sub-bands (K bins or sub-bands) and equal gain transmit beamforming weights are computed for each frequency bin using any of the processes described herein. There are processing channels for each antenna. In each processing channel, transmit filters 710 are synthesized with the frequency response specified by the beamforming weights. Thus, each transmit filter 710 has a frequency response defined by the transmit antenna weight $w_{tx}$(f) associated with that antenna. The data symbol s(n) is passed through the transmit filter 710 which in effect applies the frequency dependent antenna weight $w_{tx}$(f) to the data symbol s(n). The D/A 720 converts the digital output of the transmit filter 710 to an analog signal. The RF circuitry 730 upconverts the analog signal and couples the upconverted analog signal to an antenna 750 via a power amplifier 740.

FIG. 11 shows a reception process 800 suitable for a single carrier system. There is a processing channel for each antenna 750. In each processing channel, RF circuitry 810 downconverts the received RF signal. An A/D 820 converts the downconverted analog signal to a digital signal. Like the frequency dependent transmit antenna weights, the receive antenna weights are computed for the plurality of frequency sub-bands. Receive filters 830 are synthesized with the frequency response specified by the frequency dependent receive beamforming weights $w_{rx}$(f) and the received digital signal is passed through filters 830 for each antenna, effectively applying a frequency dependent antenna weight to the received signal for each antenna. The results of the filters 830 are combined in an adder 850, and then passed to a demodulator 860 for demodulation.

Figure 12:
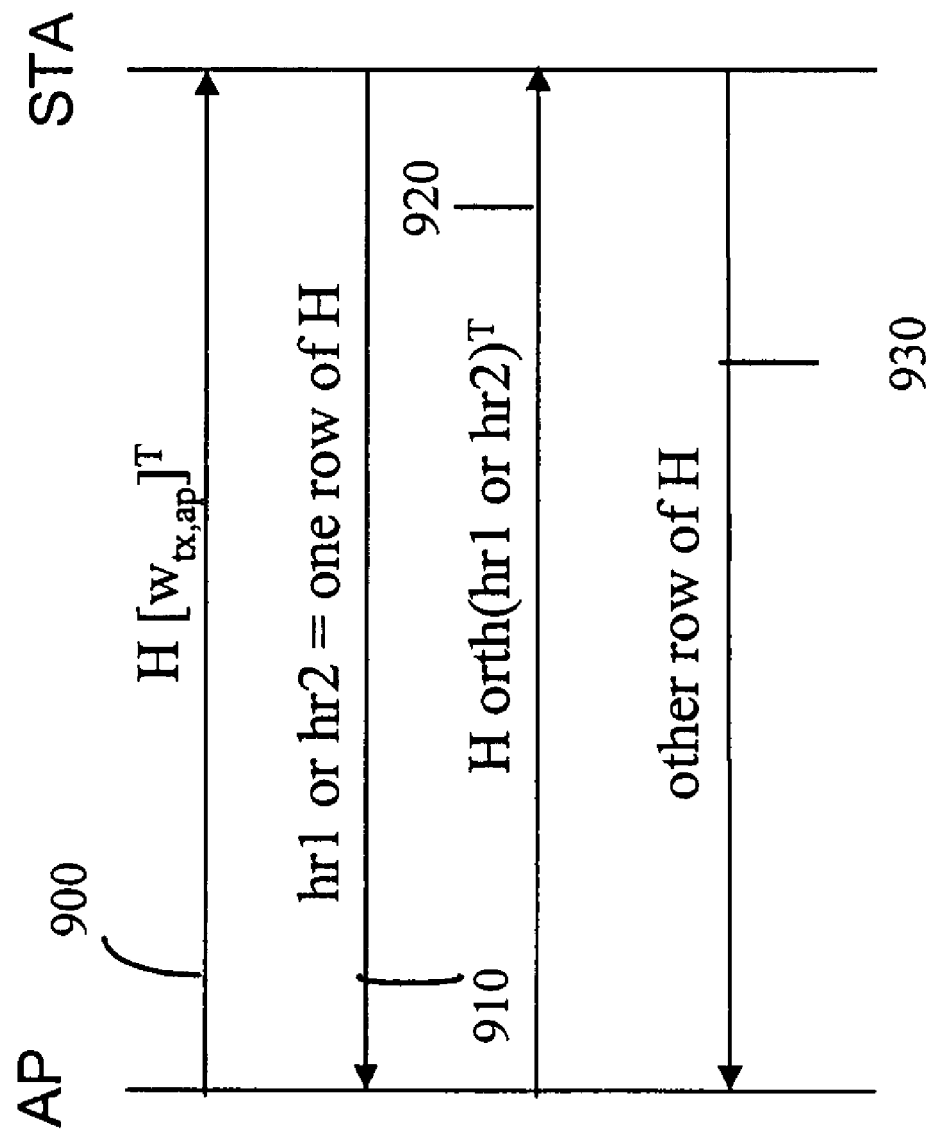
FIG. 12 is a flow diagram for a process that is useful when one device on the communication link is composite beamforming capable and the other device uses antenna selection diversity capable.

FIG. 12 shows a procedure for use when only one of the two devices supports beamforming. For example, N-CBF is supported at a first communication device (an AP) but not at a second communication device (a STA). In this case, the STA is likely to support 2-antenna Tx/Rx selection diversity as discussed previously. If this is the case, it is possible for the AP to achieve 3 dB better performance than Nth order maximal ratio combining (MRC) at both ends of the link.

When a STA associates or whenever a significant change in channel response is detected, the AP sends a special training sequence to help the STA select the best of its two antennas. The training sequence uses messages entirely supported by the applicable media access control protocol, which in the following example is IEEE 802.11x.

The sequence consists of 2 MSDUs (ideally containing data that is actually meant for the STA so as not to incur a loss in throughput). In step 900, the AP sends the first MSDU using a Tx weight vector having equal gain orthogonal transmit weights (also optionally frequency shaped). For example, if the number of AP antennas is 4, the transmit weight vector is $[1\ 1\ 1\ 1]^T$. In step 910, the 2-antenna selection diversity STA responds by transmitting a message using one of its' two antennas; the antenna that best received the signal from the AP. The AP decodes the message from the STA, and obtains one row of the H matrix (such as the first row $h_{r1}$). In step 920, the AP sends the second MSDU using a frequency dependent transmit weight vector which is orthogonal to the first row of H (determined in step 610), and equal-gain normalized such that the magnitude of the signals at each antenna is equal to P/N. In addition, the transmit weight vector may be frequency shaped across so that at each frequency of the baseband signal, the sum of the power output by the antennas of the first communication device is constant across. When the STA receives the second MSDU, it forces the STA to transmit a response message in step 630 using the other antenna, allowing the AP to see the second row of the H matrix, such as $h_{r2}$.

Now the AP knows the entire H matrix. The AP then decides which row of the H matrix will provide "better" MRC at the STA by computing a norm of each row, $h_{r1}$ and $h_{r2}$, of the H matrix and, and selecting the row that has the greater norm as the frequency dependent transmit weight vector for further transmissions to that STA until another change is detected in the channel. The row that is selected is equal gain normalized before it is used for transmitting to that STA.

Equal gain composite beamforming provides significant advantages. By reducing output power requirements for each power amplifier, the silicon area of the power amplifiers are reduced by as much as N times (where N is equal to the number of antennas) relative to non-equal gain CBF. The silicon area savings translates into a cost savings due to (1) less silicon area, and (2) the ability to integrate the power amplifiers onto the same die (perhaps even the same die as the radio frequency transceiver itself).

The efficiency (efficiency being defined as the output power divided by DC current consumption) for each power amplifier is N times larger in the EGCBF case than in the non-equal gain CBF case. With EGCBF, the same output power as non-equal CBF is achieved with N times less DC current.

Equal gain CBF reduces power requirements for each of the power amplifiers, which in turn increases the output impedance of each of the power amplifiers (since impedance is inversely proportional to current, and supply current requirements will be reduced). When the output impedance of the power amplifier is increased, the matching networks required for the power amplifiers are greatly simplified and require less silicon area. Moreover, reducing power requirements for the individual power amplifiers provides greater flexibility for systems with low supply voltage.

To summarize, a method is provided that accomplishes applying a transmit weight vector to a baseband signal to be transmitted from the first communication device to the second communication device, the transmit weight vector comprising a complex transmit antenna weight for each of N plurality of antennas of the first communication device, wherein each complex transmit antenna weight has a magnitude and a phase whose values may vary with frequency across a bandwidth of the baseband signal, thereby generating N transmit signals each of which is weighted across the bandwidth of the baseband signal, wherein the magnitude of the complex transmit antenna weight associated with each antenna is such that the power to be output at each antenna is the same and is equal to the total power to be output by all of the N antennas divided by N; receiving at the N plurality of antennas of the first communication device a signal that was transmitted by the second communication device; determining a receive weight vector comprising a plurality of complex receive antenna weights for the N plurality of antennas of the first communication device from the signals received by the N plurality of antennas, wherein each receive antenna weight has a magnitude and a phase whose values may vary with frequency; and updating the transmit weight vector for the N plurality of antennas of the first communication device for transmitting signals to the second communication device by gain normalizing the receive weight vector and computing a conjugate thereof. This process may be performed such that at substantially all frequencies of the baseband signal, the sum of the magnitude of the complex transmit antenna weights across the plurality of antennas of the first communication device is constant. Moreover, where the bandwidth of the baseband signal comprises K plurality of frequency sub-bands, the magnitude of the complex transmit antenna weights associated with each of the N plurality of antennas is such that the power to be output by each antenna is the same and is equal to 1/(KN) of the total power to be output for all of the K frequency sub-bands. This process may be embodied by instructions encoded on a medium or in a communication device.

In addition, a method is provided that accomplishes a method for communicating signals from a first communication device to a second communication device using radio frequency (RF) communication techniques, comprising: applying to a first signal to be transmitted from the first communication device to the second communication device a transmit weight vector, the transmit weight vector comprising a complex transmit antenna weight for each of the N plurality of antennas, wherein each complex transmit antenna weight has a magnitude and a phase whose values may vary with frequency across a bandwidth of the baseband signal, thereby generating N transmit signals each of which is weighted across the bandwidth of the baseband signal, wherein the magnitude of the complex transmit antenna weights associated with each antenna is such that the power to be output at each antenna is the same and is equal to the total power to be output by all of the N antennas divided by N; from a first response signal at the plurality of antennas of the first communication device transmitted from a first of two antennas of the second communication device, deriving a first row of a channel response matrix that describes the channel response between the first communication device and the second communication device; applying to a second signal for transmission by the plurality of antennas of the first communication device a transmit weight vector that is orthogonal to the first row of the channel response matrix, and wherein the transmit weight vector comprises a plurality of complex transmit antenna weights, wherein each complex transmit antenna weight has a magnitude and a phase whose values may vary with frequency across a bandwidth of the second signal, thereby generating N transmit signals each of which is weighted across the bandwidth of the baseband signal, wherein the magnitude of the complex transmit antenna weights associated with each antenna is such that the power to be output at each antenna is the same and is equal to the total power to be output by all of the N antennas divided by N; deriving a second row of the channel response matrix from a second response signal received from a second of the two antennas of the second communication device; and selecting one of the first and second rows of the channel response matrix that provides better signal-to-noise at the second communication device as the transmit weight vector for further transmission of signals to the second communication device. This process may be performed such that at substantially all frequencies of the baseband signal, the sum of the magnitude of the complex transmit antenna weights across the plurality of antennas of the first communication device is constant. Moreover, where the bandwidth of the baseband signal comprises K plurality of frequency sub-bands, the magnitude of the complex transmit antenna weights associated with each of the N plurality of antennas is such that the power to be output by each antenna is the same and is equal to 1/(KN) of the total power to be output for all of the K frequency sub-bands. This process may be embodied by instructions encoded on a medium or in a communication device.

The above description is intended by way of example only.

What is claimed is:

1. A wireless communication device, comprising:
a plurality of N antennas;
a baseband processor configured to determine a receive weight vector of a plurality of complex receive antenna weights for each of the plurality of N antennas, the receive antenna weights applied to a received baseband signal;

compute a transmit weight vector by computing a conjugate of the receive weight vector, the transmit weight vector comprising a complex transmit antenna weight for each of plurality of N antennas of the communication device, wherein each complex transmit antenna weight has a magnitude and a phase whose values may vary with frequency across a bandwidth of the baseband signal, thereby generating a plurality of N transmit signals each of which is weighted across the bandwidth of the baseband signal to be transmitted from corresponding ones of the plurality of N antennas to a second communication device, wherein the magnitude of the complex transmit antenna weight associated with each antenna is such that the power to be output at each antenna is the same and is equal to the total power to be output by all of the N antennas divided by N and such that the sum of the power at each corresponding frequency across the plurality of transmit signals is equal to a constant;

apply the transmit weight vector to a baseband signal for transmission via the plurality of N antennas; and update the transmit weight vector by repeating the determining of the receive weight vector and computing of the transmit weight vector each time signals are received to update the transmit weight vector.

2. The device of claim 1, wherein the bandwidth of the baseband signal comprises K plurality of frequency sub-bands, and the magnitude of the complex transmit antenna weights associated with each of the plurality of N antennas is such that the power to be output by each antenna is the same and is equal to $1/(KN)$ of the total power to be output for all of the K frequency sub-bands of the communication device.

3. The device of claim 2, further comprising a baseband memory configured to store, for each of the N antennas, complex transmit antenna weights for a subset of the K frequency sub-bands or sub-carriers.

4. The device of claim 3, wherein the baseband processor and the stored subset of complex transmit antenna N and generate therefrom the complete set of antenna weights for all of the K frequency sub-bands or sub-carriers using interpolation techniques.

5. The device of claim 1, wherein the receive weight vector, the transmit weight vector and the baseband signal of the are applied to each of K frequency sub-bands of the baseband signal that correspond to sub-carriers of a multi-carrier baseband signal or synthesized frequency sub-bands of a single carrier baseband signal.

* * * * *

UNITED STATES PATENT AND TRADEMARK OFFICE
CERTIFICATE OF CORRECTION

| | |
|---|---|
| PATENT NO. | : 7,881,674 B2 |
| APPLICATION NO. | : 11/879156 |
| DATED | : February 1, 2011 |
| INVENTOR(S) | : Sugar et al. |

It is certified that error appears in the above-identified patent and that said Letters Patent is hereby corrected as shown below:

ON THE TITLE PAGE

At item (56) "FOREIGN PATENT DOCUMENTS", first page, right column, before the line "99/406048 8/1999" insert therefor --EP 0901 219 03/1999--.

Signed and Sealed this
Tenth Day of May, 2011

David J. Kappos
*Director of the United States Patent and Trademark Office*